(12) United States Patent
Zilberman

(10) Patent No.: US 7,911,836 B2
(45) Date of Patent: Mar. 22, 2011

(54) DATA RESTORATION IN CASE OF PAGE-PROGRAMMING FAILURE

(75) Inventor: Eugene Zilberman, Richmond Hill (CA)

(73) Assignee: Sandisk IL Ltd, Kfar Saba (IL)

( * ) Notice: Subject to any disclaimer, the term of this patent is extended or adjusted under 35 U.S.C. 154(b) by 0 days.

(21) Appl. No.: 12/275,901

(22) Filed: Nov. 21, 2008

(65) Prior Publication Data

US 2009/0094482 A1 Apr. 9, 2009

Related U.S. Application Data

(63) Continuation of application No. 11/497,366, filed on Aug. 2, 2006, now abandoned.

(60) Provisional application No. 60/726,819, filed on Oct. 17, 2005.

(51) Int. Cl.
*G11C 11/34* (2006.01)

(52) U.S. Cl. ......... 365/185.03; 365/185.09; 365/185.12; 365/185.17; 365/185.33

(58) Field of Classification Search ............. 365/185.03, 365/185.09, 185.12, 185.17, 185.33
See application file for complete search history.

(56) References Cited

U.S. PATENT DOCUMENTS

| 5,815,439 | A | 9/1998 | Korsh et al. |
| 6,147,910 | A | 11/2000 | Hsu et al. |
| 6,411,548 | B1 | 6/2002 | Sakui et al. |
| 7,099,190 | B2 | 8/2006 | Noguchi et al. |
| 7,164,601 | B2 | 1/2007 | Mitani et al. |
| 7,230,852 | B2 | 6/2007 | Mitani et al. |
| 2005/0243626 | A1 | 11/2005 | Ronen |

OTHER PUBLICATIONS

1-Gbit NAND Twinflash; Datasheet HYF33DSIG[80/16]0CTI Infineon Technologies Rev. 1.04, Jun. 2005, 53 pages.

*Primary Examiner* — Trong Phan
(74) *Attorney, Agent, or Firm* — Davis Wright Tremaine LLP

(57) ABSTRACT

The present invention discloses systems and methods for restoring data in flash memory after an operational failure. The method includes: setting bits of a data buffer in accordance with the data; programming a plurality of memory cells in accordance with the data buffer; and upon failure of the programming step, restoring the data buffer to be set in accordance with the data, wherein the restoring is based only on a present state of the data buffer and on a present state of the plurality of memory cells. A memory device includes: at least one cell; and a controller operative to store data in at least one cell by steps including those described in the method above. The system includes: a memory device that includes at least one cell; and a processor operative to store data in at least one cell by steps including those described in the method above.

8 Claims, 8 Drawing Sheets

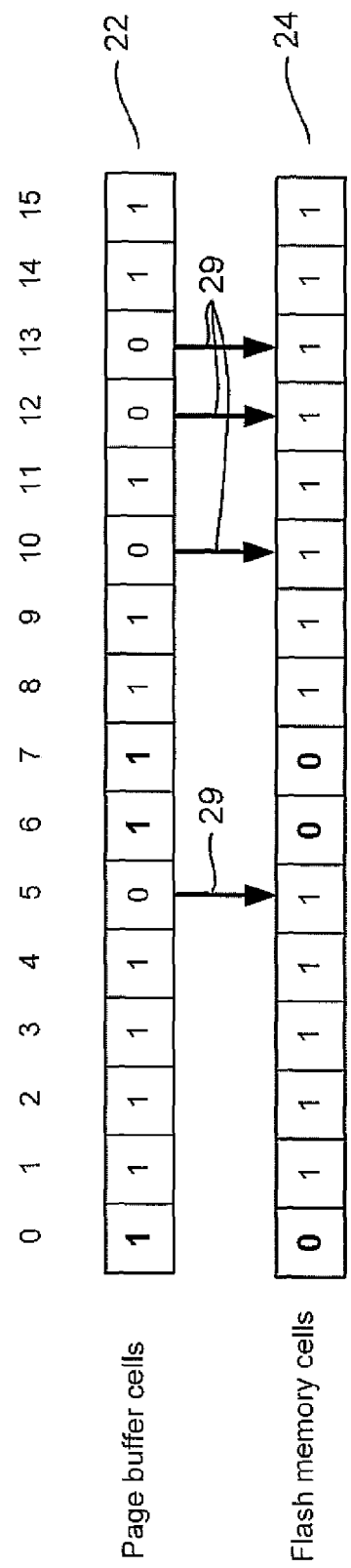
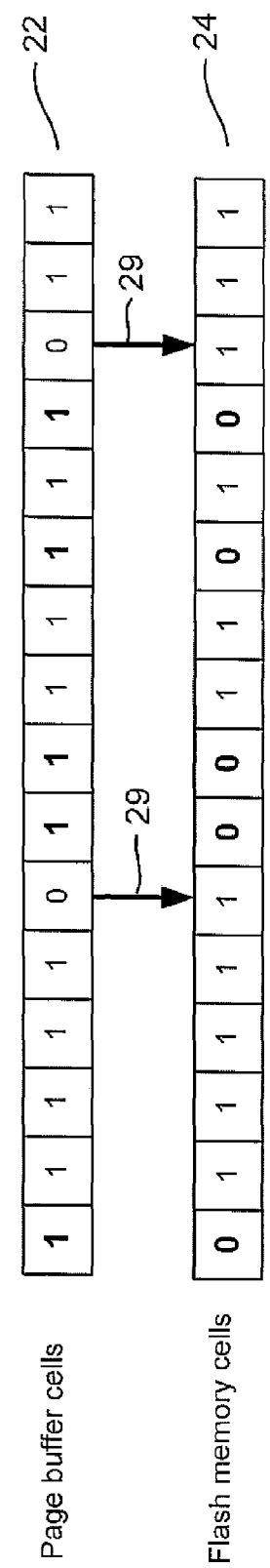
Figure 4
Figure 5

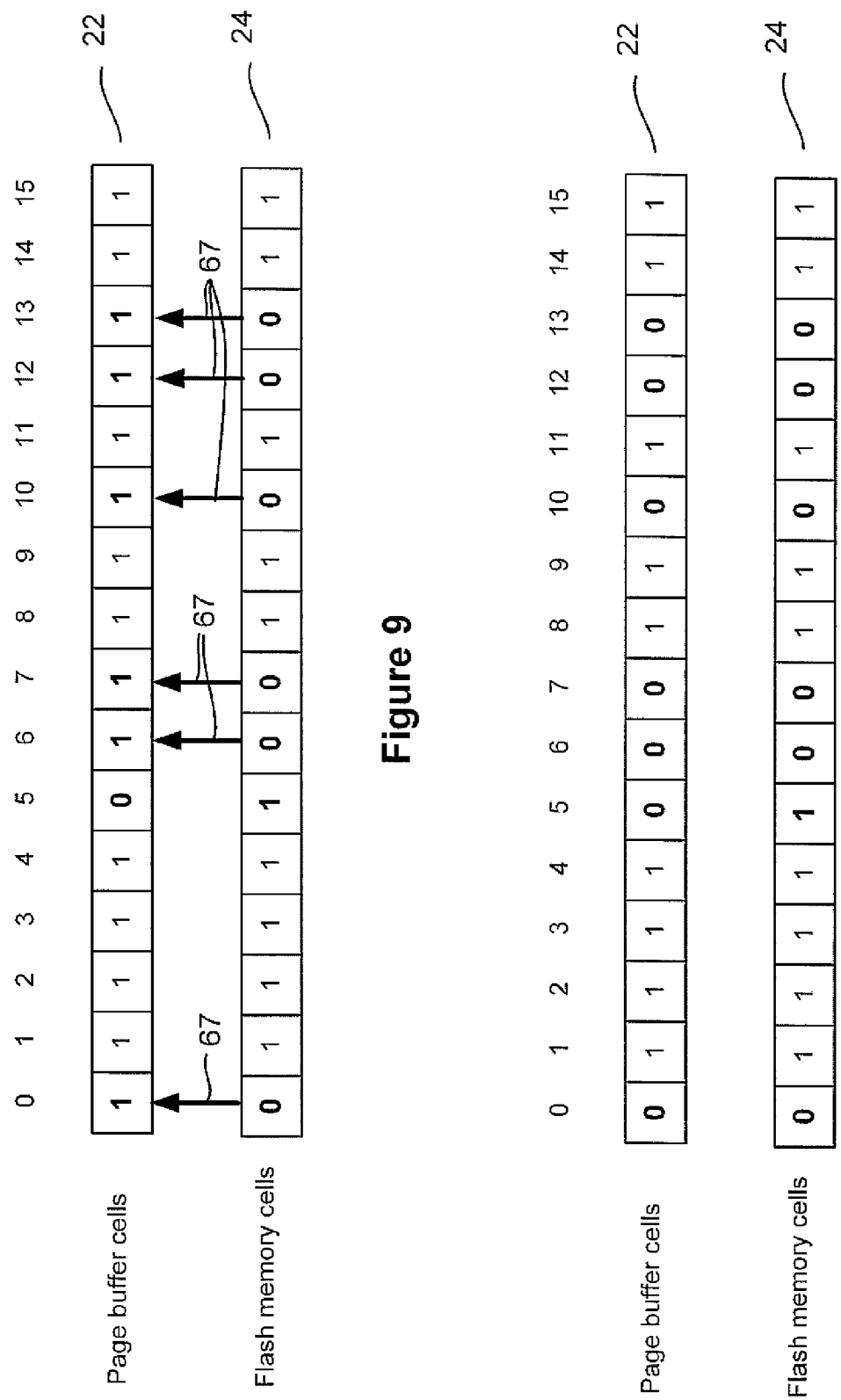

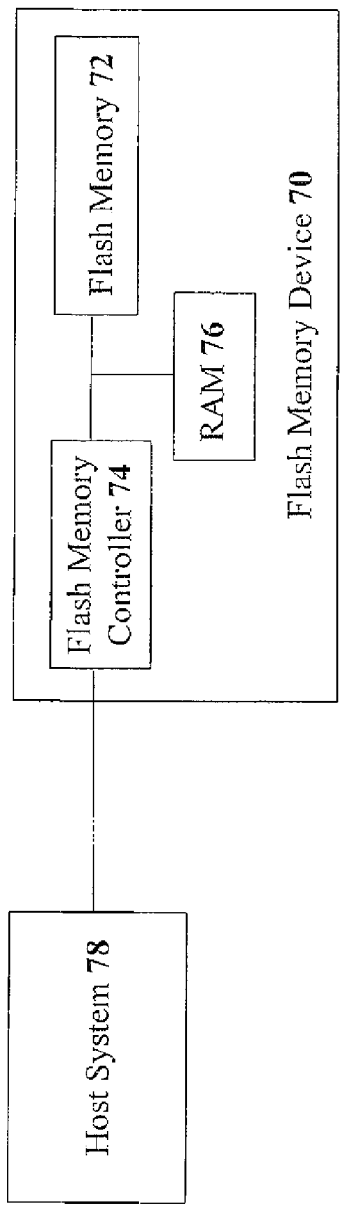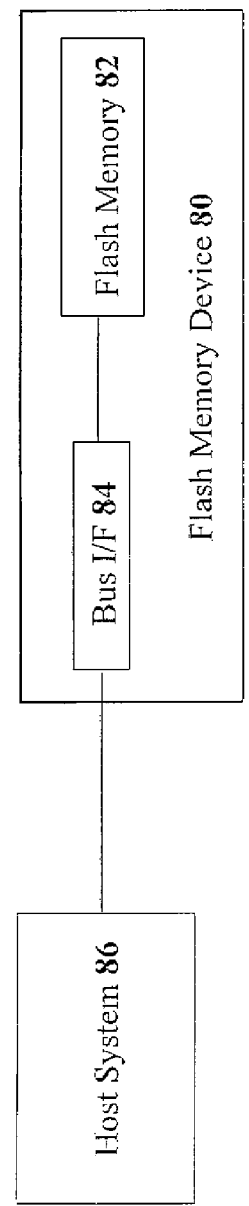
Figure 11A
Figure 11B

DATA RESTORATION IN CASE OF PAGE-PROGRAMMING FAILURE

CROSS REFERENCE TO RELATED APPLICATIONS

This Application is a Continuation of U.S. patent application Ser. No. 11/497,366, filed on Aug. 2, 2006, Publication No. 2007/0086244 A1, now abandoned, which claims the benefit of U.S. Provisional Patent Application No. 60/726,819, filed on Oct. 17, 2005.

FIELD AND BACKGROUND OF THE INVENTION

The present invention relates to systems and methods for restoring data in flash memory after an operational failure. Writing and erasing data in flash memories is well-known in the art.

The operation of flash memories is described in Ronen, U.S. Patent Publication No. 20050243626 (assigned to the assignee of the present invention and henceforth referred to as Ronen '626), which patent application is incorporated by reference for all purposes as if fully set forth herein. FIG. 1, depicting the number of cells occupied as a function of threshold voltage (adapted from FIG. 1 of Ronen '626) shows the storage of a bit, either a zero-bit or a one-bit, in a cell of an electrically programmable memory (EPROM) such as a flash memory. A cell is a memory element containing values of one or more data bits. For historical reasons, this process of storing (or writing) data in an EPROM is called "programming" the EPROM. The terms "writing" and "programming" are used interchangeably herein. Specifically, the cell, that is the subject of FIG. 1, stores one bit of data, and so commonly is called a single-level cell (SLC). Initially, the cell has a nominal threshold voltage $V_1$ that represents a one-bit. For example, after a block of a flash memory has been erased, all the cells have nominal threshold voltages $V_1$.

Because of unavoidable inaccuracies in the initializations of the cells, the actual threshold voltages are distributed around the nominal threshold voltage $V_1$ according to a distribution curve 10. Then, to each cell that is to store a zero-bit, a train of programming voltage pulses is applied, in order to inject electrons from the cell's silicon substrate through the cell's oxide layer into the cell's floating gate, until the cell's threshold voltage exceeds a reference voltage $V_0$ that represents a zero-bit. Because the electrons move through the oxide layer by quantum mechanical tunneling or by hot injection, because of non-uniformities in the cells' structures, and because the initial threshold voltages are distributed according to distribution curve 10, the threshold voltages of the cells that store zero-bits are distributed above $V_0$ according to a distribution curve 12.

A cell is read by comparing the cell's threshold voltage to a reference voltage $V_R$ that is above distribution curve 10 but below $V_0$. If the cell's threshold voltage is below $V_R$ then the cell's contents are read as a one-bit. If the cell's threshold voltage is at or above $V_R$ then the cell's contents are read as a zero-bit.

Over time, the threshold voltages of the cells that store zero-bits tend to drift downwards. Also shown in FIG. 1, as a dashed line, is a distribution curve 14 that represents the distribution of the threshold voltages of the cells that have been programmed to store zero-bits after the passage of a considerable amount of time. $V_1$, $V_R$ and $V_0$ are selected to be sufficiently far apart to preserve the reliability of the flash memory despite this drift of the threshold voltages.

One goal of the designers of flash memories is to reduce the cost per bit of storing data. This is accomplished in two ways. The first way is to use fabrication processes that cram more cells into the same semiconductor area. The second way is to use multi-level cells (MLCs) that store more than one bit per cell. Both ways of reducing costs decrease the retention time of the data. For example, multiple bits are stored in a MLC by defining $2^n$ voltage bands, to store n bits, in place of the two voltage bands (above and below $V_R$) of a SLC. Because the voltage bands of a MLC are necessarily narrower than the voltage bands of a comparable SLC, the threshold voltage of a MLC that has been programmed to store one or more zero-bits drifts down to the next band down sooner than the threshold voltage of a comparable SLC drifts below $V_R$.

Given that the logic values of cells are set by way of setting appropriate threshold voltages (the threshold voltage of a cell being a physical parameter of the cell), the value that a threshold voltage represents is implementation-dependent. In the standard SLC implementation, a threshold voltage lower than the reference voltage represents "one-logic" (i.e. a logic value of one) and a threshold voltage higher than the reference voltage represents "zero-logic" (i.e. a logic value of zero), but there is no reason why the opposite convention couldn't be implemented. In an MLC implementation, there is more than one reference voltage.

In the present invention, the process of selectively writing (i.e. programming) data to flash memory involves changing logic values of selected memory cells, typically, in a SLC implementation, from one-logic to zero-logic. The process of selectively erasing data from flash memory involves changing values of selected memory cells, typically from zero-logic to one-logic. However, as explained above, this designation is arbitrary, and would be equally implementable in the opposite designation.

Some flash memory devices are optimized to write data in pages, which are typically 512 or 2048 bytes in size. The most widely-known example of such flash memory devices uses NAND-type flash memory. The term "NAND-type" will be used throughout the present application to refer to flash memory technologies that are optimized to write data in full-page increments (as opposed to NOR-type flash memory in which data can be written at the word level).

Storing data on a NAND-type flash memory comprises several steps. First, a Data Input command is issued, indicating the address of the page that should be written. Next, the data is transferred to the memory. Finally, a Page Program command is issued. (It should be noted that although specific command names vary among NAND-type flash memory manufacturers, the command structure for storing a full page is identical.)

Existing NAND-type flash memories have one or more page buffers (i.e. memory cells with read/write capability), which receive the data before the data is programmed into the flash memory cells. Existing page-programming methods, for flash memory in which each flash memory cell contains one bit of information and erased flash memory cells have one-logic, implement the following steps:

(1) Apply a programming voltage pulse only to flash memory cells that have zero-logic in the corresponding cells of the page buffer, where a programming voltage pulse is a single attempt to set a cell to the desired threshold voltage, typically many such pulses are required to achieve the required voltage level;

(2) Read the data programmed into the memory;

(3) Set the corresponding cells of the page buffer to one-logic for all flash memory cells that return zero-logic when read;

(4) Repeat steps 1-3 until all cells in the page buffer contain one-logic or until the number of pulses exceeds the maximum number allowed; and (5) If the number of pulses exceeds the maximum number allowed, then return a failure status for the page-programming operation.

Whenever the Page Program operation terminates with failure, the data that failed to be programmed has to be programmed into a different location in the flash memory. The page-programming method described above modifies the contents of the page buffer, making the method unusable for programming the data onto a different location.

As a result, programming data onto a different location requires keeping a copy of that data in a backup RAM buffer. Allocating such a backup buffer may consume significant RAM capacity, and may raise costs significantly for low-end systems. In addition, if the flash memory device receives streaming data from a host system, the flash memory device needs to be able to write this data simultaneously both to the backup buffer and to the flash memory interface, otherwise performance will be deteriorated. This requirement, in turn, complicates the flash memory device's internal architecture.

One example of a prior art device is the 1-GBit NAND TwinFlash.™. (see datasheet HYF33DS1G[80/16]OCTI available from Infineon Technologies North America Corporation, 1730 North First Street, San Jose, Calif. 95112). While this prior art device features the capability to recover data from a flash buffer, the method of recovery is not elaborated in any detail in the cited datasheet.

It would be desirable for low-end flash memory devices to be able to retrieve data that has been written to a page from the flash memory itself, in order to re-write the data to another page without the need to keep a backup copy of that data in the RAM buffer.

SUMMARY OF INVENTION

It is the purpose of the present invention to provide the ability to calculate the original value of every bit in a page buffer from the value of the same bit after a persistent data-writing failure and the value of the corresponding bit in the flash memory. By applying this calculation, the contents of the page buffer can be restored.

For the purpose of clarity, several terms which follow are specifically defined for use within the context of this application. The terms "erasing" and "writing" are used in this application to refer to setting threshold voltages of a memory cell, where erasing sets the voltages to correspond to one-logic values, and writing sets the voltages to correspond to zero-logic values. The terms "writing" and "programming" are used interchangeably herein. The present invention applies to both single-level-cell (SLC) flash memories and multi-level-cell (MLC) flash memories. While the subsequent discussion focuses primarily on SLC cells, it will be clear to those skilled in the art how the present invention applies to MLC cells.

The threshold voltage of a MLC represents a bit pattern. In a four-level cell, for example, a threshold voltage in the lowest threshold voltage range could represent the bit pattern 11, a threshold voltage in the second threshold voltage range could represent the bit pattern 10, a threshold voltage in the third threshold voltage range could represent the bit pattern 01 and a threshold voltage in the fourth (i.e. highest) threshold voltage range could represent the bit pattern 00.

The term "programming cycle" is used in this application to refer to a single attempt, as described in the Field and Background section of the present application, to set a cell voltage to the necessary threshold voltage required for the programming operation. As mentioned above, in practice, multiple programming cycles are commonly necessary to achieve the desired voltage change. The term "persistent failure" is used in this application to refer to a failure response after a maximum number of unsuccessful programming cycles have been performed.

The term "AND-logic operation" is used in this application to refer to operations where zero-logic AND zero-logic equal zero-logic, one-logic AND zero-logic equal zero-logic, zero-logic AND one-logic equal zero-logic, and one-logic AND one-logic equal one-logic. The term "OR-logic operation" is used in this application to refer to operations where zero-logic OR zero-logic equals zero-logic, one-logic OR zero-logic equals one-logic, zero-logic OR one-logic equals one-logic, and one-logic OR one-logic equals one-logic.

Therefore, according to the present invention, there is provided for the first time a method for storing data, the method including the steps of: (a) setting bits of a data buffer in accordance with the data; (b) programming a plurality of memory cells in accordance with the data buffer; and (c) upon failure of the programming step, restoring the data buffer to be set in accordance with the data, wherein the restoring is based only on a present state of the data buffer and on a present state of the plurality of memory cells.

Preferably, the memory cells are flash memory cells.

Preferably, the memory cells are single-level memory cells.

Preferably, the step of restoring is performed by applying a logic operation between the bits in the data buffer and corresponding memory cell bits.

Preferably, the step of restoring is performed by applying a logic operation between the bits in the data buffer and corresponding memory cell bits.

Preferably, the step of restoring includes: (i) detecting memory cell bits that have been successfully programmed during the programming step; and (ii) copying the memory cell bits to corresponding locations in the data buffer.

According to the present invention, there is provided for the first time a memory device including: (a) at least one cell; and (b) a controller operative to store data in at least one cell by steps including: (i) setting bits of a data buffer in accordance with the data; (ii) programming a plurality of memory cells in accordance with the data buffer; and (iii) upon failure of the programming step, restoring the data buffer to be set in accordance with the data, wherein the restoring is based only on a present state of the data buffer and on a present state of the plurality of memory cells.

According to the present invention, there is provided for the first time a system for storing data, the system including: (a) a memory device that includes at least one cell; and (b) a processor operative to store data in at least one cell by steps including: (i) setting bits of a data buffer in accordance with the data; (ii) programming a plurality of memory cells in accordance with the data buffer; and (iii) upon failure of the programming step, restoring the data buffer to be set in accordance with the data, wherein the restoring is based only on a present state of the data buffer and on a present state of the plurality of memory cells.

These and further embodiments will be apparent from the detailed description and examples that follow.

BRIEF DESCRIPTION OF THE DRAWINGS

The present invention is herein described, by way of example only, with reference to the accompanying drawings, wherein:

FIG. 2 is a simplified schematic diagram of the initial state of a flash memory, according to a preferred embodiment of the present invention;

FIG. 3 is a simplified schematic diagram of the first programming cycle of the flash memory of FIG. 2, according to a preferred embodiment of the present invention;

FIG. 4 is a simplified schematic diagram of the second programming cycle of the flash memory of FIG. 2, according to a preferred embodiment of the present invention;

FIG. 5 is a simplified schematic diagram of the third programming cycle of the flash memory of FIG. 2, according to a preferred embodiment of the present invention;

FIG. 9 is a simplified schematic diagram of a restoration procedure, to correct the unsuccessful programming of FIG. 7, using selective bit update, according to a preferred embodiment of the present invention;

FIG. 10 is a simplified schematic diagram of the restored page after completion of the restoration procedure, shown in FIG. 9, using selective bit update, according to a preferred embodiment of the present invention;

FIG. 11A is a high-level block diagram of a flash memory device, according to a preferred embodiment of the present invention;

FIG. 11B is a high-level block diagram of a flash memory device, according to another preferred embodiment of the present invention.

DESCRIPTION OF THE PREFERRED EMBODIMENTS

Figure 1:
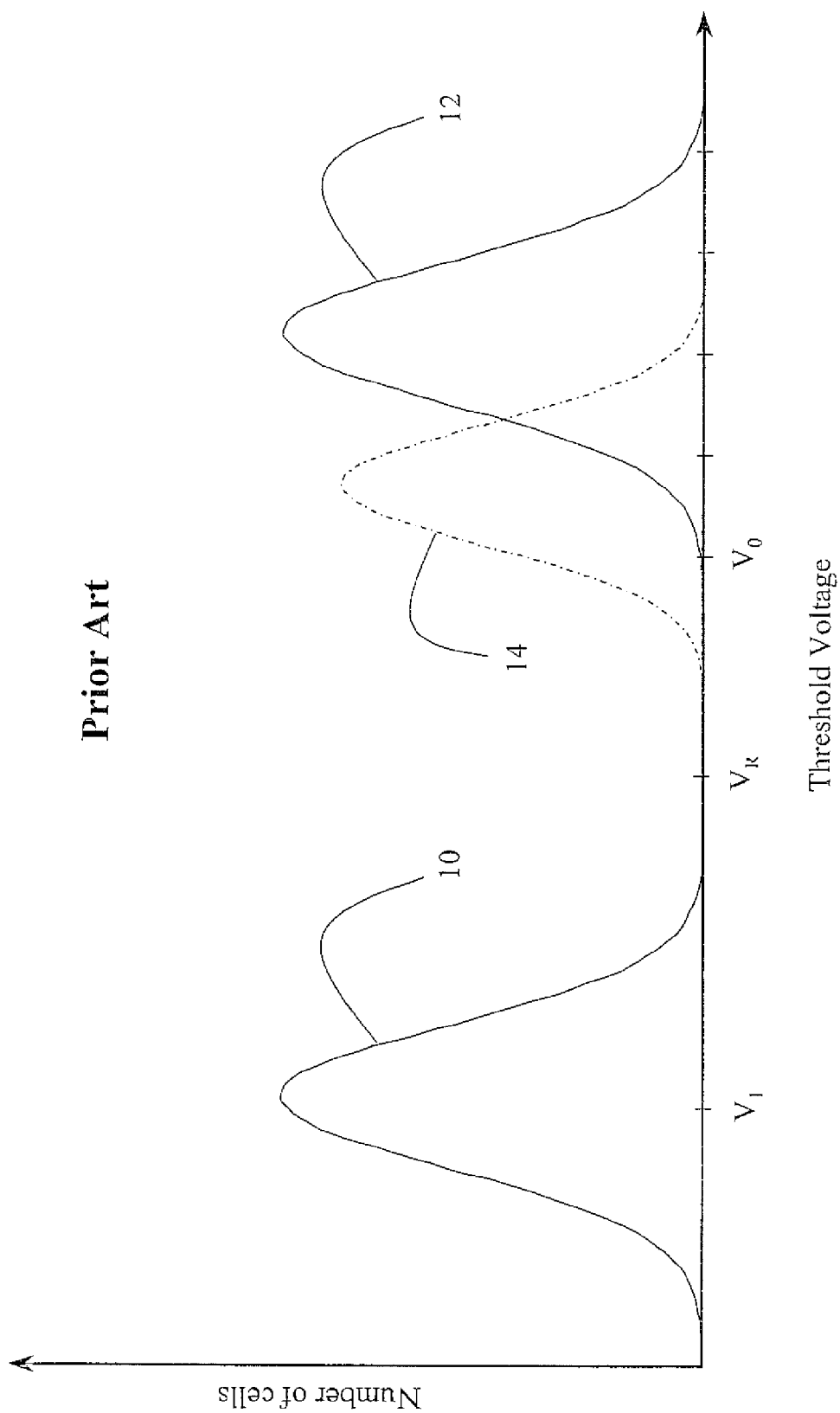
FIG. 1 shows the storage of a bit in a single-level cell (SLC) flash memory, according to the prior art.

The present invention relates to systems and methods for restoring data in flash memory after an operational failure. The principles and operation for restoring data in flash memory after an operational failure, according to the present invention, may be better understood with reference to the accompanying description and the drawings.

The present invention includes a method that allows flash memory to restore the former contents of a page buffer in the event that a programming failure occurs as a result of reaching the maximum number of programming cycles. First, we will consider the case of flash memories in which each flash memory cell stores one bit of data (i.e. single-level cells or SLCs).

As a result of partially-successful write operations following page-programming operations described above, the page buffer, which is the origin of the write data, has zero-logic in all locations where the programming operation has failed to turn one-logic into zero-logic in a flash memory page, which is the destination of the write data. The page buffer has one-logic in all locations where the write operation has successfully turned one-logic into zero-logic in the flash memory page.

In the event that some bits fail to be written, the original contents of the page buffer are restored by adding the following Recover Page Buffer AND-logic operation to the system process, as follows:

For every cell in the flash memory page:
(1) Read the logic value of the flash memory cell;
2) Perform AND-logic operation with the corresponding bit in the page buffer; and
3) Store the result in the corresponding bit in the page buffer.

The same effect is achieved by carrying out the following alternative procedure:

For every cell in the flash memory page:
(1) Read the logic value of the flash memory cell; and
(2) If obtained logic value is zero-logic, set the corresponding bit of the page buffer to zero-logic.

The first procedure is preferred for a sequential approach, where bit values obtained from the flash memory cells are sequentially passed through the AND-logic gate. The second procedure is preferred for a parallel approach, where bit values obtained from the flash memory cells are stored in the page buffer if the bit values pass the comparator logic. In either case, some processing is saved by performing these steps only for those cells in the flash memory page that correspond to one-logic in the page buffer.

A different case arises for flash memory technology for which an erased flash memory cell has zero-logic. As a result of partially-successful write operations following page-programming operations described above, the page buffer has one-logic in all locations where the programming operation has failed to turn zero-logic into one-logic in a flash memory page. The page buffer has zero-logic in all locations where the write operation has successfully turned zero-logic into one-logic in the flash memory page.

In the event that some bits fail to be written, the original contents of the page buffer are restored by adding the following Recover Page Buffer OR-logic operation to the system process, as follows:

For every cell in the flash memory page:
(1) Read the logic value of the flash memory cell;
(2) Perform OR-logic operation with the corresponding bit in the page buffer; and
(3) Store the result in the corresponding cells in the page buffer.

The same effect is achieved by carrying out the following alternative procedure:

For every cell in the flash memory page:
(1) Read the logic value of the flash memory cell; and
(2) If obtained logic value is one-logic, set the corresponding bit of the page buffer to one-logic.

In either case, some processing is saved by performing these steps only for those cells in the flash memory page that correspond to zero-logic in the page buffer.

Some NAND-type flash memories implement a multi-level cell (MLC) technology, in which each flash memory cell stores more than one bit. Logic values other than one-logic and zero-logic are possible. For example, a two-bit flash memory cell can store values of 00-logic, 01-logic, 10-logic, and 11-logic. Separate page-programming commands in such MLC flash memories affect only one of the bits stored in the flash memory cell. In the MLC context, the expression "a flash memory cell logic-value" means "a logic value of the bit affected by the current page-programming command", so that the Recover Page Buffer procedures are applicable to both SLC flash memories and MLC flash memories. In MLC implementations, there is a one-to-one correspondence between bit significance and page.

In MLC flash devices, "page" is a logical construct, not a physical construct. Therefore, if one has an array of 512 two-bit cells and the page size is 512 bits, one can store two pages in the array in several ways. One approach ("significance approach") is to store all the least-significant bits as bits of the first page, and to store all the most-significant bits as bits of the second page. Another approach ("sequential approach") is to store all the bits of the first 256 cells as bits of the first page, and to store all the bits of the last 256 cells as bits of the second page. The present invention relates to the significance approach of using an MLC array.

After a Recover Page Buffer operation has been executed, the original data in the page buffer is restored, and can be read from the page buffer and programmed into a different location in the flash memory. These Recover Page Buffer operations can either require explicit commands to be sent to flash memory, either by the host system or by a flash memory controller, or the commands can be executed automatically in case of the programming failure. In the first case, explicit commands can allow retrieval of the page buffer contents as part of the commands. In the second case, the flash memory can implement separate commands, allowing retrieval of the contents of the page buffer.

Figures 2, 3:
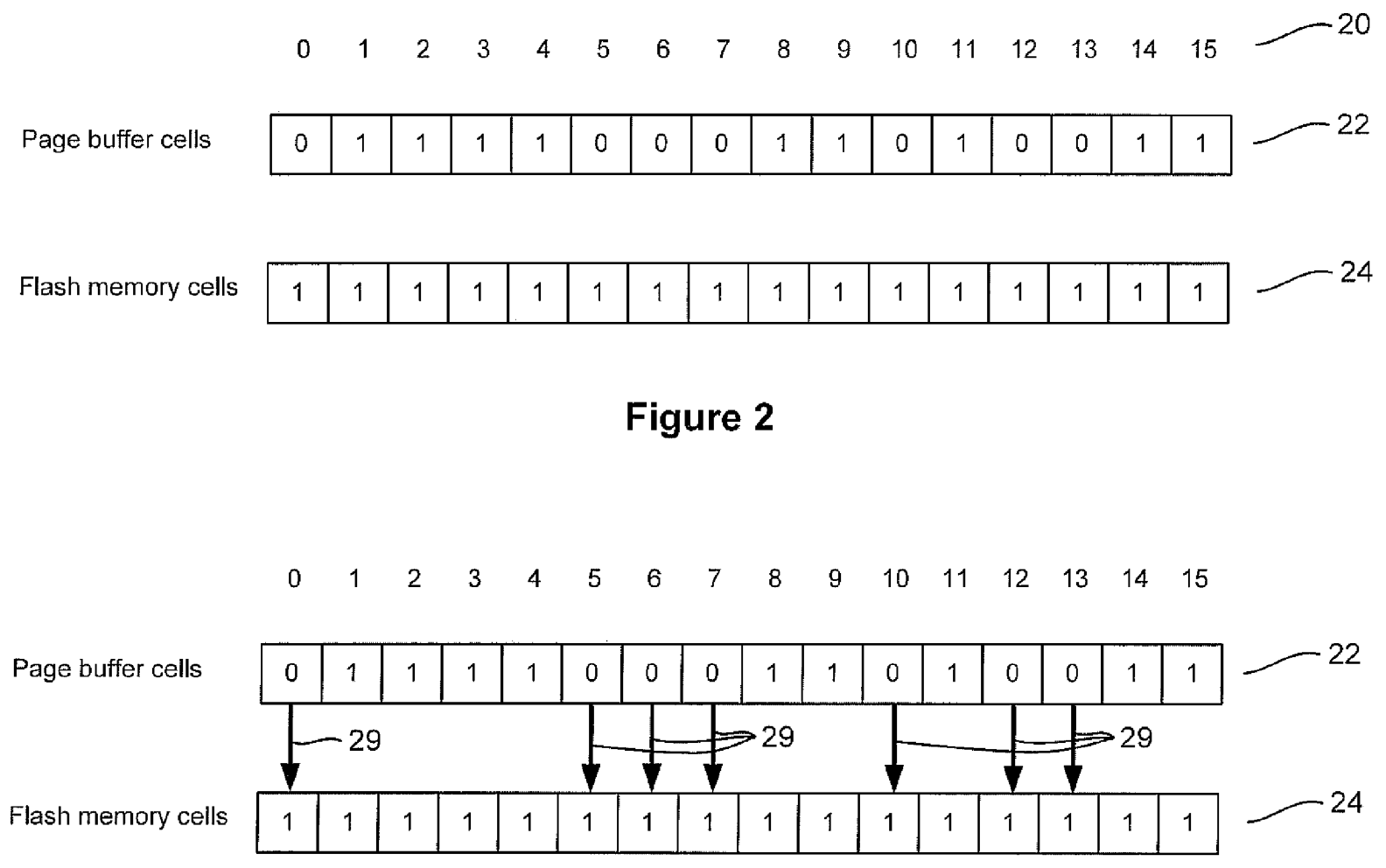

Referring now to the drawings, FIG. 2 is a simplified schematic diagram of the initial state of a flash memory. The flash memory includes a 16-bit page buffer 22 and a 16-bit flash memory cell array 24. This simplified example is representative of much larger memory buffers and flash cell arrays that can be implemented. Page buffer 22 contains the data to be written to memory cell array 24. The addresses (e.g. 0, 1, 2, 3, etc.) of each cell are indicated in a list 20. The initial contents of memory cell array 24 is all one-logic, which is the typical contents following an erase operation.

FIG. 3 is a simplified schematic diagram of the first programming cycle of the flash memory of FIG. 2. For all cells having zero-logic in page buffer 22, programming pulses 29 are applied to the corresponding flash memory cells in memory cell array 24. Programming pulses 29 are intended to change these cells in memory cell array 24 from one-logic to zero-logic. The resulting successfully-programmed cells are indicated in FIG. 4 with bolded-text cell values.

FIG. 4 is a simplified schematic diagram of the second programming cycle of the flash memory of FIG. 2. As shown in FIG. 4, flash memory cells, from page buffer 22 with addresses 0, 6, and 7, were successfully programmed into memory cell array 24 (i.e. changed to zero-logic) as a result of the first programming cycle. A successful programming of these cells causes the corresponding cells in page buffer 22 (i.e. addresses 0, 6, and 7) to change from zero-logic to one-logic. Addresses 5, 10, 12, and 13 were not successfully programmed in the first cycle, and are being programmed again in FIG. 4.

FIG. 5 is a simplified schematic diagram of the third programming cycle of the flash memory of FIG. 2. As shown in FIG. 5, flash memory cells, from page buffer 22 with addresses 10 and 12, were successfully programmed into memory cell array 24 as a result of the third programming cycle. A successful programming of these cells causes the corresponding cells in page buffer 22 (i.e. addresses 10 and 12) to change from zero-logic to one-logic. Addresses 5 and 13 were not successfully programmed in the second cycle, and are being programmed again in FIG. 5.

Figure 6:
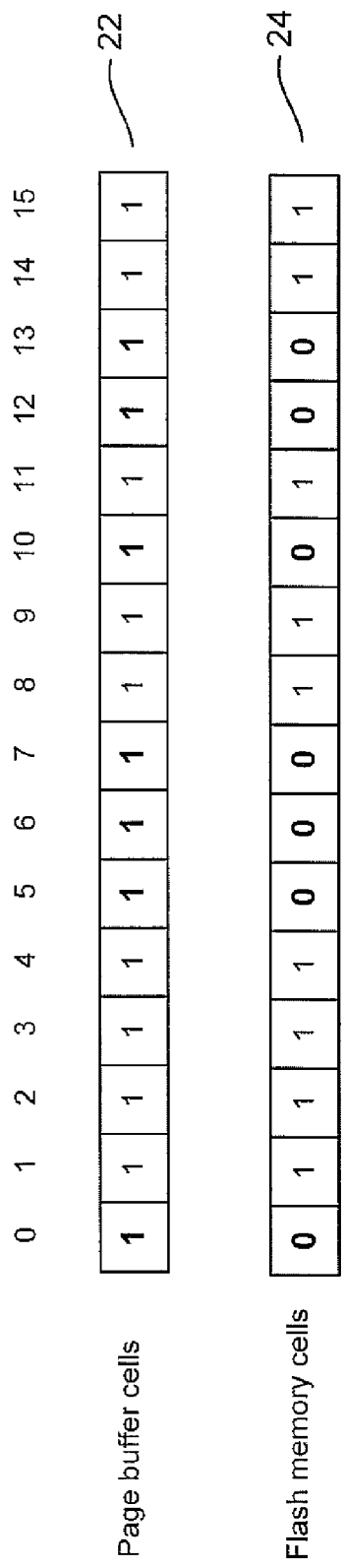
FIG. 6 is a simplified schematic diagram of a successful programming after the third programming cycle of the flash memory of FIG. 2, according to a preferred embodiment of the present invention.

FIG. 6 is a simplified schematic diagram of a successful programming after the third programming cycle of the flash memory of FIG. 2. In this scenario, flash memory cells, from page buffer 22 with addresses 5 and 13, were successfully programmed into memory cell array 24 as a result of the third programming cycle. A successful programming of these cells causes the corresponding cells in page buffer 22 (i.e. addresses 5 and 13) to change from zero-logic to one-logic.

Figure 7:
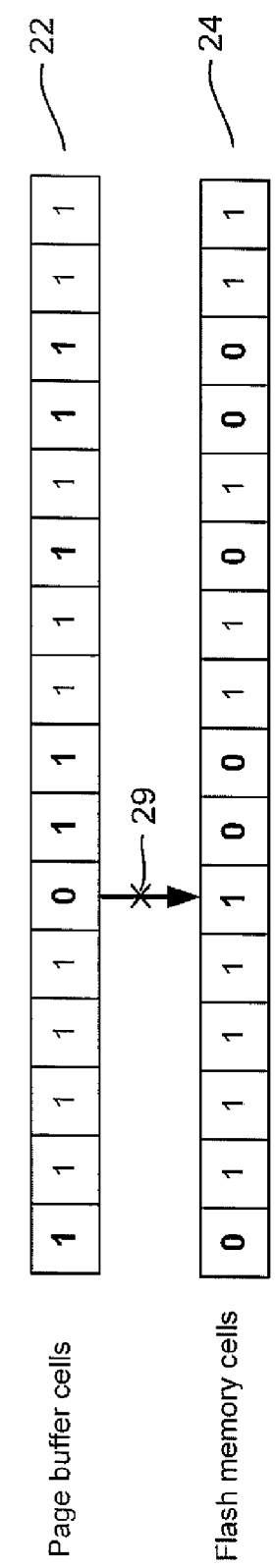
FIG. 7 is a simplified schematic diagram of an unsuccessful programming after the third programming cycle of the flash memory of FIG. 2, according to a preferred embodiment of the present invention.

FIG. 7 is a simplified schematic diagram of an unsuccessful programming after the third cycle of a flash memory. We assume that memory cell array 24 has a maximum number of programming cycles equal to three. In this scenario, flash memory cell with address 13, from page buffer 22, was successfully programmed into memory cell array 24 as a result of the third programming cycle, but flash memory cell with address 5 was not successfully programmed. No further attempts to program flash memory cells are made, and this situation is considered a page-programming failure.

Figure 8:
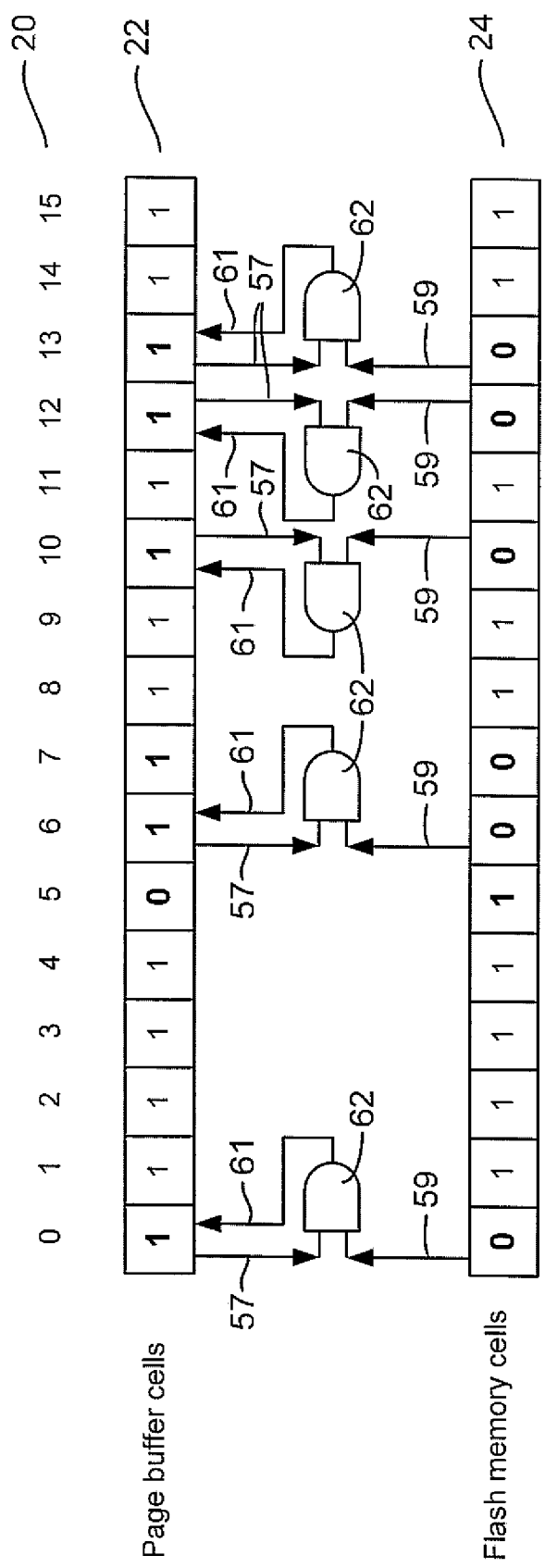
FIG. 8 is a simplified schematic diagram of a restoration procedure, to correct the unsuccessful programming of FIG. 7, using a bit-wise logic operation, according to a preferred embodiment of the present invention.

FIG. 8 is a simplified schematic diagram of a restoration procedure, to correct the unsuccessful programming of FIG. 7, using a bit-wise logic operation. Memory logic-values 59 are retrieved from a memory cell array 24. Corresponding buffer logic-values 57 are retrieved from page buffer 22. Paired logic-values 59 and 57, one from memory cell array 24 and one from page buffer 22, are inputs to a logic operation 62 (in this case, an AND-logic operation). Outputs 61 of the logic operation 62 are written back to the corresponding cells in page buffer 22.

FIG. 9 is a simplified schematic diagram of a restoration procedure, to correct the unsuccessful programming of FIG. 7, using selective bit update. For flash memory cells in memory cell array 24 whose logic values are equal to a specific logic value (in this case, zero-logic), the corresponding cells in page buffer 22 are written with similar logic values 67.

FIG. 10 is a simplified schematic diagram of the restored page after completion of the restoration procedure, shown in FIG. 9, using selective bit update. The contents of the cells in page buffer 22 (including the cells written from memory cell array 24) are identical to their contents before the start of the page-programming procedure (i.e. as in page buffer 22 shown in FIG. 2).

FIG. 11A is a high-level block diagram of a flash memory device, according to a preferred embodiment of the present invention. FIG. 11A is adapted from FIG. 2 of Ronen '626. A flash memory device 70 includes a flash memory 72, a controller 74, and a RAM 76 (i.e. random access memory). Flash memory device 70 is shown coupled to a host system 78. Controller 74, which corresponds to "flash control 14" of Ronen '626, manages flash memory 72, with the help of RAM 76, as described in Ronen '626. Controller 74 also supports restoring of data as described above.

Optionally, the flash memory device can be configured without a controller. FIG. 11B is a high-level block diagram of a flash memory device, according to another preferred embodiment of the present invention. FIG. 11B is adapted from FIG. 3 of Ronen '626. A flash memory device 80 includes a flash memory 82 and a Bus I/F (interface) 84. Flash memory device 80 is shown coupled to a host system 86. In this configuration, the functions of controller 74 shown in FIG. 11A, as well as the data restoration method described above, are performed by host system 86.

Figure 12:
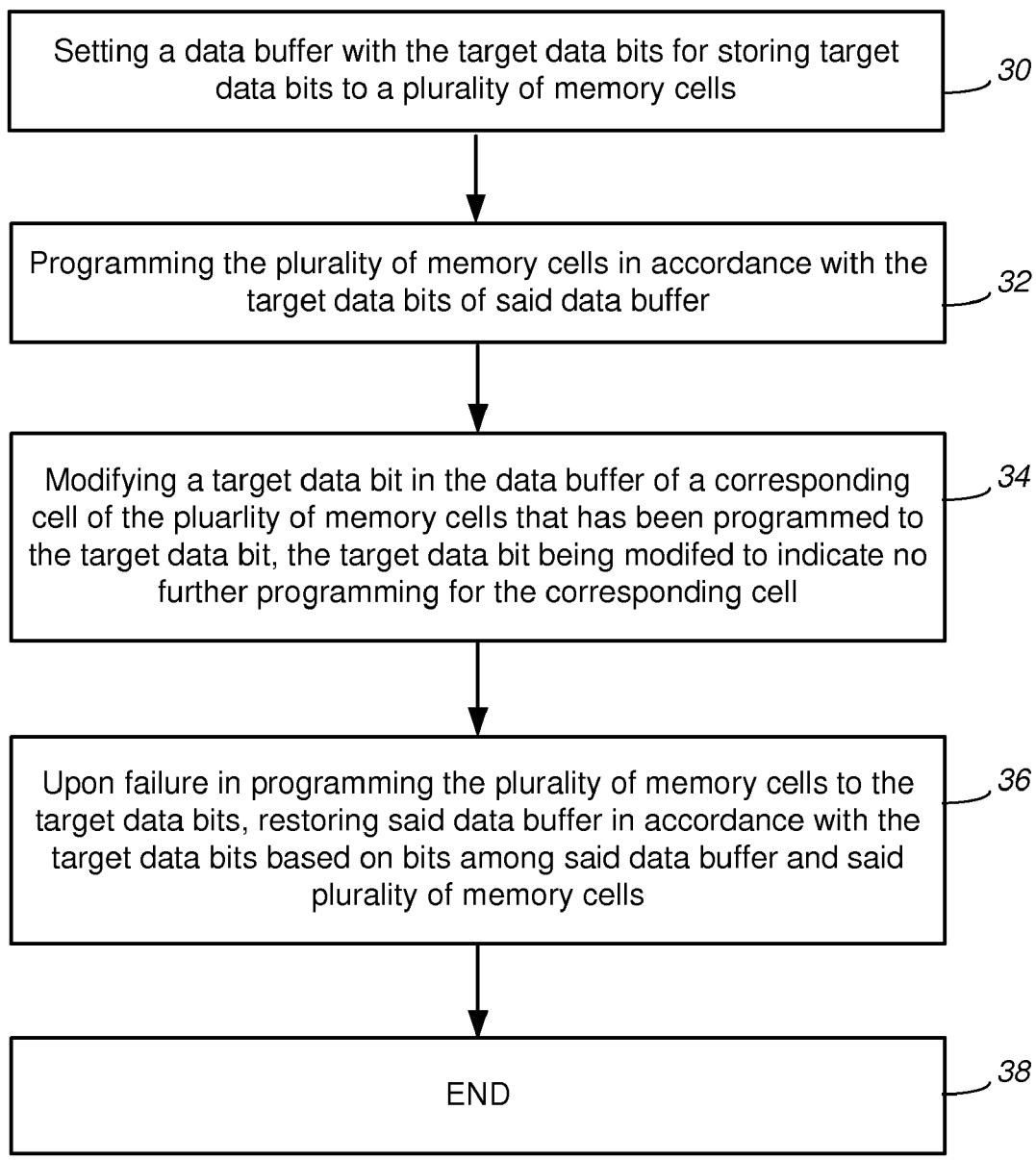
FIG. 12 is a flow diagram illustrating a preferred embodiment of the invention in which the data buffer is restored upon failure in programming.

FIG. 12 is a flow diagram illustrating a preferred embodiment of the invention in which the data buffer is restored upon failure in programming. The flow diagram is labeled by STEPs 30, 32, 34, 36, and 38.

It is claimed:

1. A method for storing target data bits to a plurality of memory cells, the method comprising the steps of:
   (a) setting a data buffer with the target data bits;
   (b) programming the plurality of memory cells in accordance with the target data bits of said data buffer;
   (c) modifying a target data bit in the data buffer of a corresponding cell of the pluarlity of memory cells that has been programmed to the target data bit, the target data bit being modifed to indicate no further programming for the corresponding cell; and
   (d) upon failure in programming the plurality of memory cells to the target data bits, restoring said data buffer in accordance with the target data bits based on bits among said data buffer and said plurality of memory cells.

2. The method of claim 1, wherein said memory cells are flash memory cells.

3. The method of claim 1, wherein said memory cells are single-level memory cells.

4. The method of claim 1, wherein said memory cells are multi-level memory cells.

5. The method of claim 1, wherein said step of restoring is performed by applying a logic operation between said bits in said data buffer and in said plurality of memory cells.

6. The method of claim 1, wherein said step of restoring includes:
   (i) detecting memory cells that have been successfully programmed during said programming step; and
   (ii) copying bits in said memory cells to corresponding locations in said data buffer.

7. A memory device comprising:
   (a) a plurality of memory cells; and
   (b) a controller operative to store target data in said plurality of memory cells in parallel, including:
      (i) setting a data buffer with the target data bits;
      (ii) programming said plurality of memory cells in accordance with said data buffer;
      (iii) modifying a target data bit in the data buffer corresponding to a cell that been programmed to the target data bit; and;
      (iv) upon failure in programming the plurality of memory cells to the target data, restoring said data buffer in accordance with the bits of the target data based on current bits among said data buffer and said plurality of memory cells.

8. A system for storing target data bits to a plurality of memory cells, the system comprising:
   (a) a memory device that includes a plurality of memory cells; and
   (b) a processor operative to store target data in said pluarity of memory cells in parallel, including:
      (i) setting a data buffer with the target data bits;
      (ii) programming said plurality of memory cells in accordance with the target data bits of said data buffer;
      (iii) modifying a target data bit in the data buffer of a corresponding cell of the pluarlity of memory cells that has been programmed to the target data bit; and
      (iv) upon failure in programming the plurality of memory cells to the target data bits, restoring said data buffer in accordance with the target data bits based on bits among said data buffer and said plurality of memory cells.

* * * * *